United States Patent [19]

Eads et al.

[11] 4,045,684

[45] Aug. 30, 1977

[54] INFORMATION TRANSFER BUS CIRCUIT WITH SIGNAL LOSS COMPENSATION

[75] Inventors: William Donovan Eads; David Steven Maitland, both of Loveland, Colo.

[73] Assignee: Hewlett-Packard Company, Palo Alto, Calif.

[21] Appl. No.: 650,344

[22] Filed: Jan. 19, 1976

[51] Int. Cl.² .................... H03K 17/16; H03K 17/60; H03K 19/08; H03K 19/20
[52] U.S. Cl. .......................... 307/200 B; 307/205; 307/208; 307/251; 307/DIG. 4
[58] Field of Search .............. 307/208, 221 R, 221 C, 307/240, 241, 246, 251, 269, 270, DIG. 4, DIG. 5

[56] References Cited

U.S. PATENT DOCUMENTS

| 3,517,210 | 6/1970 | Rubinstein | 307/246 X |
| 3,646,369 | 2/1972 | Fujimoto | 307/270 |
| 3,675,043 | 7/1972 | Bell | 307/208 X |
| 3,789,239 | 1/1974 | Heeren | 307/221 C |

OTHER PUBLICATIONS

Cox et al., "An FET 4-Phase Dynamic Off-Chip Driver with Polarity Hold," *IBM Tech. Discl. Bull.;* vol. 17, No. 2, pp. 466-467; July, 1974.

*Primary Examiner*—John S. Heyman
*Assistant Examiner*—Larry N. Anagnos
*Attorney, Agent, or Firm*—William E. Hein

[57] ABSTRACT

An information transfer bus circuit useful in metal oxide semiconductor integrated circuits employs a network to compensate for signal losses arising from capacitance associated with gating devices in the circuit.

3 Claims, 4 Drawing Figures 4,045,684

INFORMATION TRANSFER BUS CIRCUIT WITH SIGNAL LOSS COMPENSATION

BACKGROUND AND SUMMARY OF THE INVENTION

Electronic calculators, microprocessors, and other information processing devices frequently employ bus circuits to transfer information from one register or storage device to another.

One method of accomplishing this information transfer employs stray capacitance associated with circuits, such as metal oxide semiconductor (MOS) integrated circuits, to store signal levels associated with the data to be transferred. These levels are transferred to their intended destination by means of gating devices responsive to clocking signals supplied to the transfer circuitry. One method employing stray capacitance, referred to hereinafter as the precharge method of transfer, involves charging a bus line to a predetermined level when one clocking signal is activated, and then using the logic level of the data to be transferred to either discharge the bus line or to leave the line charged when another clocking signal is activated. Circuits employing this precharge method of transfer are susceptible to undesirable signal level degradations, however, due to unwanted stray capacitance associated with gating devices in the circuit.

Accordingly, it is the principal object of this invention to provide an information transfer bus circuit using the precharge method of transfer which overcomes the signal level degradation resulting from unwanted stray capacitance associated with gating devices in the circuit. Other and incidental objects of this invention will become apparent from a reading of this specification and an inspection of the accompanying drawings.

These objects are accomplished in accordance with the preferred embodiment of the invention by the inclusion of a compensation network in the information transfer bus circuit. This compensation network enhances relevant signal levels in the bus circuit sufficiently to overcome signal level degradation caused by the unwanted stray capacitance associated with gating devices in the circuit. As a result, the chances of erroneous data transfers, due to noise or other factors in the information bus transfer circuit employing the precharge method of transfer, are greatly reduced.

DESCRIPTION OF THE PREFERRED EMBODIMENT

Figure 1:
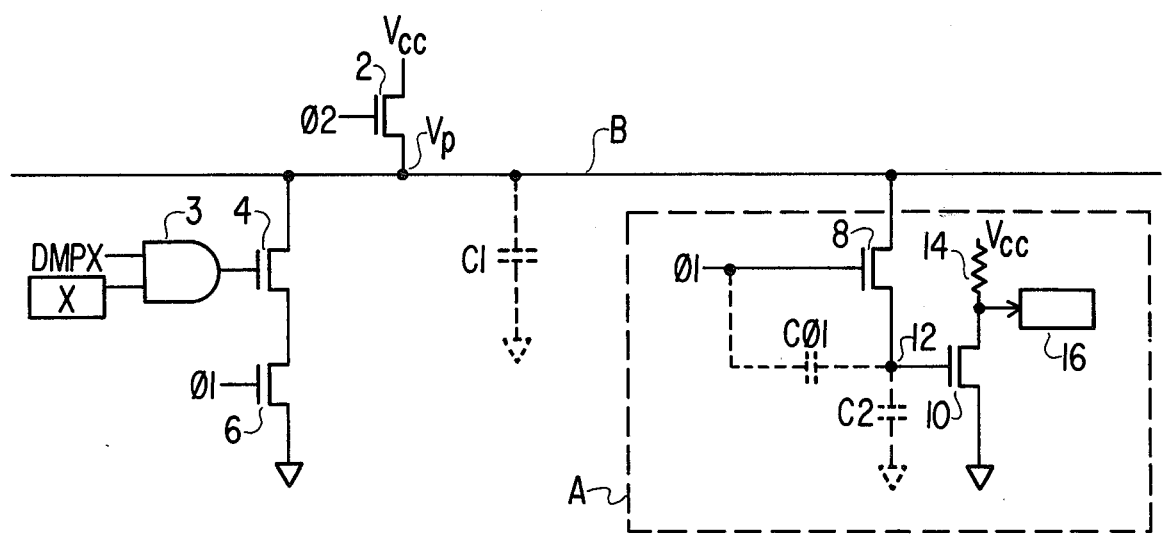
FIG. 1 shows a circuit employing the precharge method for transferring information bits from selected registers onto an information transfer bus.

Referring now to FIG. 1, there is shown a circuit which employs a precharge method for transferring information from a selected register X to a destination A via a bus B. Destination A is typically a register. Register X represents one of a number of registers from which information may be transferred via the bus B, and register A represents one of a number of registers which may receive the transferred information when appropriate selection circuitry within the register is activated. For simplicity, selection circuitry for register A is not shown in FIG. 1.

The information transfer is controlled by two clock signals 01 and 02 which alternately go high, but which are never high simultaneously. When the clock signal 02 is high, a precharge gate 2 is turned on to allow the bus B to assume a precharge voltage level Vp which is a function of the high level of the clock signal 02. After the clock signal 02 returns low, the voltage potential on the bus B remains at the precharge voltage level $V_p$ as a result of stray capacitance C1 that exists between the bus B and ground. The bus B may be of substantial physical length in relation to other distances within the circuit, and thus may have a significantly large stray capacitance C1 associated with it. Once the bus B has been charged to the precharge voltage level $V_p$, register A is ready to receive information from the bus.

The input circuitry for register A typically comprises a transfer gate 8, which connects the register to the bus B, and an isolation device 10 which couples the signal from the output of gate 8, designated as junction 12, to other circuitry 16 of register A. Isolation device 10 may comprise an inverter or other device with a high impedance. The transfer of information is accomplished by connecting register X and a register selection signal DMPX to the input of a logic gate 3 to produce a control signal DMPX . X which controls a data transfer gate 4. The actual information transfer occurs when clock signal 01 goes high and turns on an enabling gate 6 and the transfer gate 8. When transfer gate 8 is turned on, the bus B is connected to the inverter 10, and thus to the other circuitry 16 of register A. The logic level of register X determines the status of gate 4, and, consequently, the status of bus line B and the data transferred to register A.

If, for example, the signal from register X is high, control signal DMPX . X will be high, data transfer gate 4 will be turned on, and the bus B will be discharged to approximately zero volts through data transfer gate 4 and enabling gate 6. The level at junction 12, which is the input to inverter 10, also becomes nearly zero volts, and causes a high logic level to appear at the output of inverter 10. The logic level at junction 12, which reflects the status of the signal from register X, remains unchanged after clock signal 01 returns low and until the next clock signal 01 allows a new transfer.

If the signal from register X is low, control signal DMPX . X will be low, data transfer fate 4 will remain off, and, ideally, no change in level of the bus B will occur at the time clock signal 01 goes high and transfer gate 8 turns on. In fact, however, a stray capacitance C2 between junction 12 and ground causes a slight reduction in the voltage appearing at junction 12. The new voltage level appearing at junction 12 is given by (C1 . Vp)/(C1 + C2). Since the physical distance between transfer gate 8 and inverter 10 is generally much shorter than the length of bus B, however, capacitance C2 is generally much smaller than capacitance C1, and the reduction in the voltage level present on bus B when transfer gate 8 turns on is negligible.

When the clock signal 01 begins to return low, gate 8 immediately turns off and the voltage level present on bus B is trapped on capacitance C2. At this point in time an undesirable additional voltage level reduction occurs at junction 12 due to another stray capacitance C01 between the gating input of transfer gate 8, which is connected to clock signal 01, and the output of transfer gate 8, which is connected to junction 12. Capacitance C01 is smaller than capacitance C2, but is not insignificant with respect thereto. Capacitance C01 couples junction 12 to clock signal 01, and a voltage change which materially lowers the voltage level at junction 12 results from a level change of clock signal 01. Thus, if the level of clock signal 01 decreases by a voltage $\Delta V01$, the voltage level at junction 12 decreases an amount given by $(C01 \cdot \Delta V01)/(C01 + C2)$. This decrease in level may be sufficient to cause errors in the data received by register A due to noise at junction 12.

Figure 2:
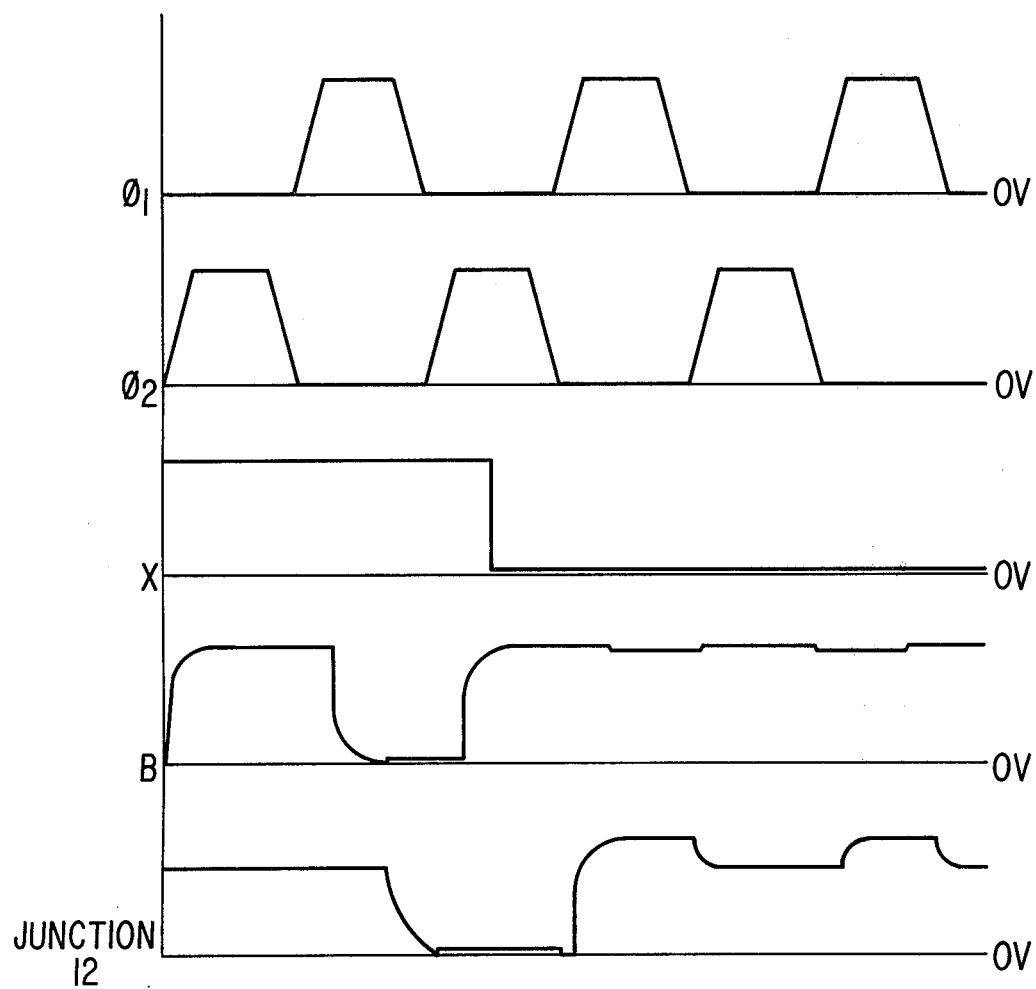
FIG. 2 shows typical waveforms associated with selected signals of the information transfer bus circuit of FIG. 1.

Referring now to FIG. 2, there is shown a waveform diagram illustrating the relationship between clock signal 01, clock signal 02, the signal on bus B, and the signal at junction 12 in the circuit of FIG. 1 for both a low and high signal from register X. Rise and fall times of illustrated waveforms are exaggerated to better show the changes in the selected signals.

Figure 3:
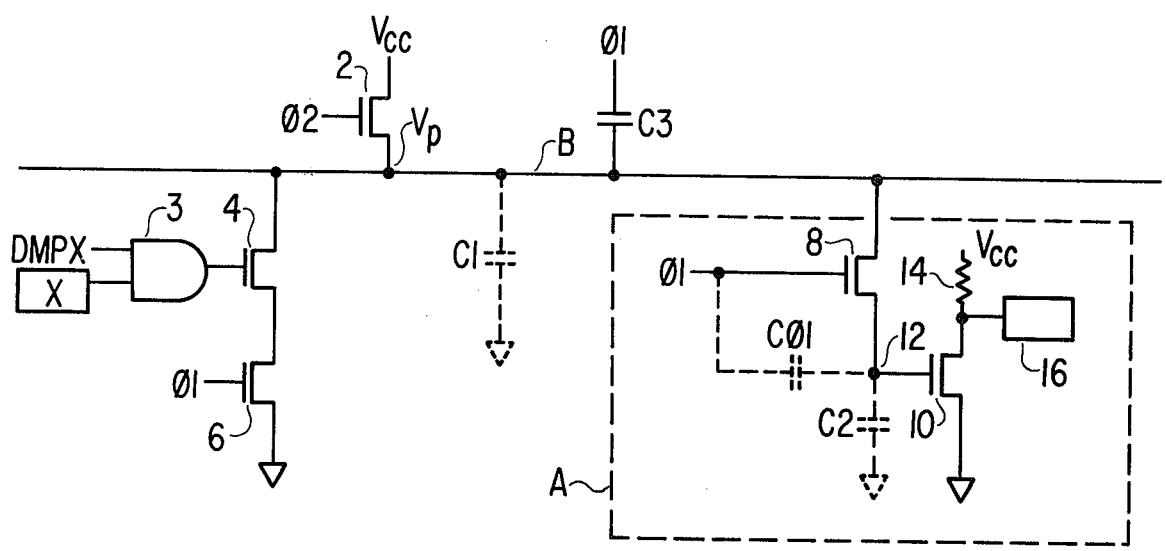
FIG. 3 shows an improved information transfer bus circuit having a compensation network that counteracts signal level degradation inherent in the information transfer bus circuit of FIG. 1.

Referring now to FIG. 3, there is shown the information transfer bus circuit of FIG. 1 with an additional physical capacitor C3 to compensate for the undesirable reduction in voltage level at junction 12 that occurs as described above. As illustrated, capacitor C3 is connected between the bus B and the source of clock signal 01. Typically, capacitor C3 is chosen to be a fraction of capacitance C1. Capacitor C3 has no effect on the precharge cycle initiated when clock signal 02 is high, except that capacitor C3, in addition to stray capacitance C1, must be charged to the precharge voltage Vp.

When the clock signal 01 goes high, however, the voltage level on bus B also tends to increase. Thus, if the control signal DMPX . X is low, an increase in the level of clock signal 01 by a voltage $\Delta V01$, produces an increase in the voltage level on bus B, over the precharge voltage Vp, of magnitude given by $(C3 \cdot \Delta V01)/(C3 + C1)$ due to added capacitor C3 being connected to clock signal 01. As clock signal 01 begins to return low, capacitor C3 causes the voltage level on bus B to also begin to decrease. After the level of clock signal 01 has declined only a slight amount, however, transfer gate 8 shuts off so that junction 12 is not affected by most of this decrease. After transfer gate 8 turns off, the voltage level reduction previously described for the circuit of FIG. 1 still occurs at junction 12. The reduction is now from the higher level received from bus B, however, and the final voltage trapped at junction 12 remains at a higher and more satisfactory level, thus insuring better noise immunity.

An incidental beneficial effect of added capacitor C3 occurs when the control signal DMPX . X is high and data transfer gate 4 turns on. As in the circuit of FIG. 1, the level of bus B goes to approximately zero volts due to the discharge of capacitance C1 and added capacitor C3 through data transfer gate 4 and enabling gate 6. As the clock signal 01 starts to fall, however, the enabling gate 6 is shut off, and the voltage level on bus B is driven negative by a voltage amount given by $(C3 \cdot \Delta V01)/C1 + C3)$. This negative level also appears at junction 12 to the extent that the level on bus B has changed prior to transfer gate 8 shutting off. An improved "zero" on bus B is thus obtained and transferred to junction 12.

Figure 4:
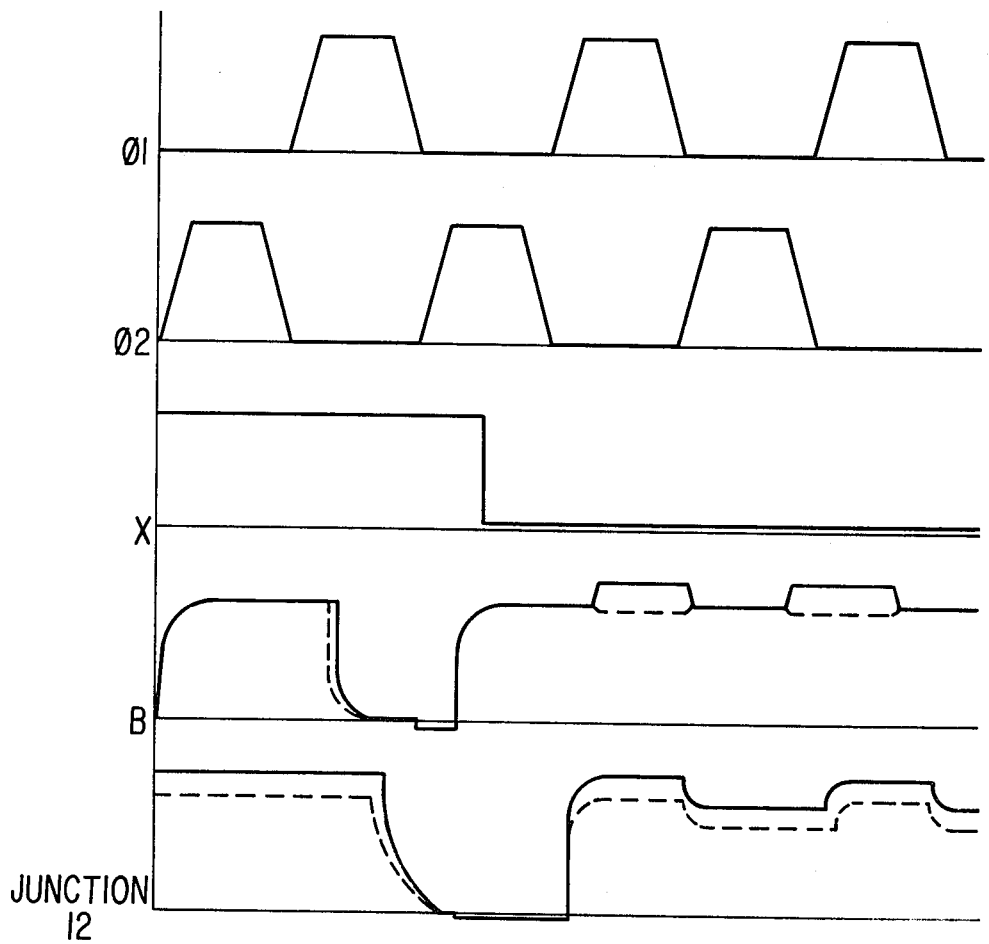
FIG. 4 shows typical waveforms associated with selected signals of the improved information transfer bus circuit of FIG. 3.

Referring now to FIG. 4, there is shown a waveform diagram illustrating the relationship between clock signal 01, clock signal 02, the signal on bus B, and the signal at junction 12 in the improved circuit of FIG. 3 for both a low and high signal from register X. The waveforms of FIG. 2 appear as dotted lines in FIG. 4 to allow comparison of the operation of the circuits of FIGS. 1 and 3.

The improved information transfer bus circuit of FIG. 3 may be typically implemented by the use of metal oxide semiconductor (MOS) integrated circuits. When MOS integrated circuitry is used, gates 2, 4, 6, and 8 may be field effect transistors (FET's) fabricated in the circuit. Inverter 10 may also be a FET connected to a load 14 to thus produce an output level to the other circuitry 16 of register A equal to a high logic level when the FET if off, and equal to a low logic level when the FET is on. Typical levels for clock signals 01 and 02 are +12 volts in the active state and 0 volts in the inactive state, thus producing a voltage change $\Delta V01$ of approximately +12 volts when clock signal 01 makes a transition to its active state, and −12 volts when the clock signal 01 returns to its inactive state. Added capacitor C3 may comprise a MOS capacitor in the integrated circuit. The maximum value of capacitor C3 is then limited by physical dimensions attainable within the integrated circuit, and is typically about ten percent of the stray capacitance C1 associated with the bus B.

We claim:

1. An information transfer bus circuit for transferring data bits to a selected destination in response to a predetermined sequence of first and second clocking signals, the bus circuit comprising:

a bus line having an associated first inherent capacitance storing a voltage representing a signal applied to the bus line;

precharge means connected to the bus line and responsive to the second clocking signal, for precharging the bus line to a predetermined voltage level when the second clocking signal is activated;

at least one data gating means connected to the bus line and arranged for receiving the first clocking signal and a selected data bit to be transferred to the selected destination, said data gating means being operative for discharging the precharged bus line when the first clocking signal is activated and the selected data bit is in a first logic state, said data gating means being further operative for maintaining the predetermined voltage level to which the bus line has been precharged when the first clocking signal is activated and the selected data bit is in a second logic state;

at least one destination circuit connected to the bus line for receiving the selected data bit to be transferred, said destination circuit including a transfer gate connected to the bus line, the transfer gate being arranged for receiving the first clocking signal, the transfer gate including a second inherent capacitance storing the voltage representing the signal applied to the bus line in response to the first clocking signal; and a voltage enhancement capacitor connected to the bus line for coupling the first clocking signal to the bus line, said voltage enhancement capacitor being operative for enhancing the average high and low voltage levels within the destination circuit.

2. An information transfer bus circuit as in claim 1 wherein:

the destination circuit includes isolation means connected to the transfer gate for receiving the voltage stored on the second inherent capacitance; and the transfer gate includes a third inherent capacitance coupling the first clocking signal to the second inherent capacitance and the isolation means.

3. An information transfer bus circuit as in claim 2 wherein:

the information transfer bus circuit is fabricated as a metal oxide semiconductor integrated circuit;

the transfer gate and isolation means comprise field effect transistors within the metal oxide semiconductor integrated circuit;

the third inherent capacitance comprises a stray capacitance associated with the transfer gate field effect transistor; and the voltage enhancement capacitor is selected to compensate for a reduction in the voltage stored on the second inherent capacitance resulting from the presence of the third inherent capacitance.

* * * * *